United States Patent
Wester

(10) Patent No.: US 6,362,513 B2
(45) Date of Patent: *Mar. 26, 2002

(54) CONFORMAL COLOR FILTER LAYER ABOVE MICROLENS STRUCTURES IN AN IMAGE SENSOR DIE

(75) Inventor: Neil S. Wester, Tempe, AZ (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/349,553

(22) Filed: Jul. 8, 1999

(51) Int. Cl.[7] .................. H01L 31/0232; H01L 31/062; H01L 31/113
(52) U.S. Cl. ........................................ 257/432; 257/294
(58) Field of Search ................................ 257/294, 432, 257/436, 443

(56) References Cited

U.S. PATENT DOCUMENTS

| | | | | |
|---|---|---|---|---|
| 4,633,075 A | * | 12/1986 | Sakai et al. | 250/201 |
| 5,677,200 A | | 10/1997 | Park et al. | 438/70 |
| 5,682,215 A | | 10/1997 | Nishihara et al. | 349/95 |
| 5,711,890 A | * | 1/1998 | Hawkins et al. | 216/24 |
| 5,734,190 A | * | 3/1998 | Hawkins et al. | 257/432 |
| 5,796,154 A | * | 8/1998 | Sano et al. | 257/432 |

* cited by examiner

*Primary Examiner*—Allan R. Wilson
(74) *Attorney, Agent, or Firm*—Blakely, Sokoloff, Taylor & Zafman LLP

(57) ABSTRACT

An embodiment of the invention is a semiconductor die having a number of photodetecting sites that are part of a color image sensor. A number of microlens structures are provided, each positioned above a respective one of the photodetecting sites. A color filter layer is formed above the microlens structures. No passivation layer is formed between the microlens structures and a top metal layer of the die. The die may be used as the eye of an electronic system such as a digital camera.

21 Claims, 4 Drawing Sheets

CONFORMAL COLOR FILTER LAYER ABOVE MICROLENS STRUCTURES IN AN IMAGE SENSOR DIE

FIELD OF THE INVENTION

This invention is generally related to semiconductor image sensor dies and related wafer/die fabrication techniques, and more particularly to image sensor dies having color filter layers and microlens structures.

BACKGROUND

Image sensor dies that can electronically capture a scene in color are at the hearts of a wide range of consumer products such as digital still cameras and video cameras. FIG. 1 shows a cross-section of a conventional color image sensor die. The die is one of many identical dies that are manufactured simultaneously in a semiconductor wafer. The dies are formed layer by layer, normally beginning with an array of photodetecting sites 104 (photosites). Other integrated circuit elements, such as transistors, which cooperate with the photodetecting sites 104 to provide an image signal are not shown. The photosites 104 and the other circuit elements are interconnected using one or more metal layers 112. Only the top most such layer is shown in FIG. 1. The top most metal layer 112 typically forms a grid above the array of photosites to roughly define a well above each site 104. A color filter material is then deposited into the wells across the entire wafer, usually above a passivation layer 116. This material is repeatedly deposited and patterned so that each photosite 104 will have one of several different color filters 120 directly above it. Each photosite will thus respond only to light of a specific color which can pass through its corresponding filter. To improve the efficiency with which a photosite 104 responds to incident light, a microlens structure 128 that focuses the incident light is formed over each photosite. This combination of photosite 104, color filter 120, and microlens structure 128 will be referred to here as a color photocell.

One of the problems with a sensor die built using the above described color photocell is the presence of small differences in the image signals obtained from theoretically identical photocells that are subjected to the same incident light. These differences are sometimes referred to as photo response non uniformity (PRNU) noise and can significantly, and adversely, affect the accuracy or sharpness of the electronic image captured by the sensor die. The non-uniform thickness of the microlens structure 128 and the underlying color filter 120 across many thousands of photocells in the sensor array may be the cause of such a noise problem.

A limited solution that helps alleviate the PRNU noise is to place a planarization layer 124 between the color filters 120 and the microlens structures 128, as shown in FIG. 1. This makes the total thickness of the optical structure that includes the microlens, the planarization layer, and the color filter more controllable and hence more uniform across the sensor die. However, such a solution requires the additional process step of depositing and finishing the planarization layer 124. Such an additional process step contributes significantly to the overall cost of the sensor die.

SUMMARY

An embodiment of the invention is a semiconductor die having a number of photodetecting sites. A microlens structure is positioned above each one of the photodetecting sites with a color filter above the microlens structure.

Other features and advantages of the invention will be apparent from the accompanying drawings and from the detailed description that follows below.

BRIEF DESCRIPTION OF THE DRAWINGS

The invention is illustrated by way of example and not by way of limitation in the figures of the accompanying drawings in which like references indicate similar elements and in which.

DETAILED DESCRIPTION

An embodiment of the invention is directed to a method of manufacturing a color image sensor die without making a planarization layer, and by forming the color filter layer above the microlens structure rather than below it as done conventionally. Experiments have shown that the color filter layer of such a structure conforms to the shape of the underlying microlens and maintains a substantially uniform thickness throughout the wafer. The microlens structures also maintain a substantially uniform shape throughout the wafer, even in the absence of a planarization layer underneath. This combination may help reduce PRNU noise from the color sensor die while at the same time reduce the overall cost of the die by eliminating the planarization layer.

Figure 1:
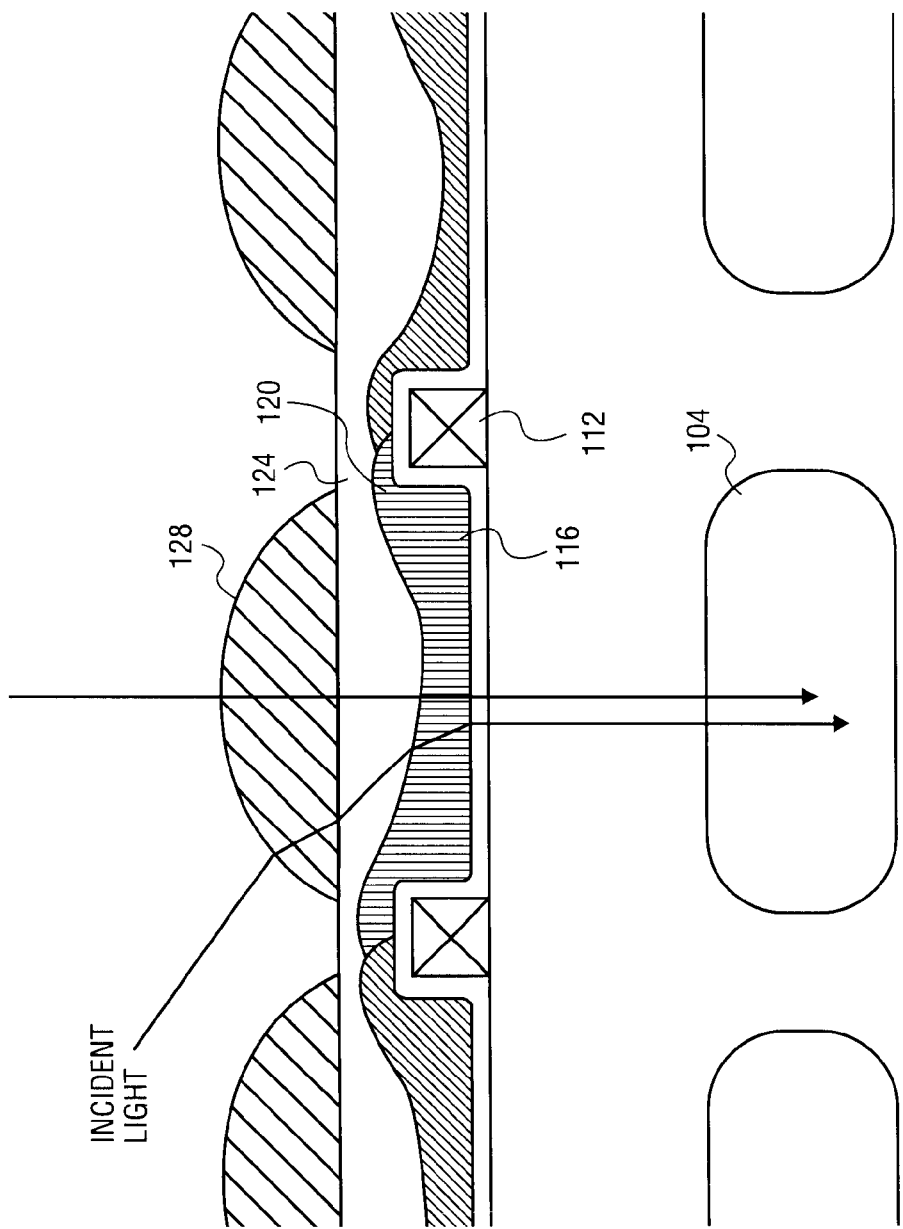
FIG. 1 shows a cross-sectional view of a portion of a conventional color sensor die.
Figure 2:
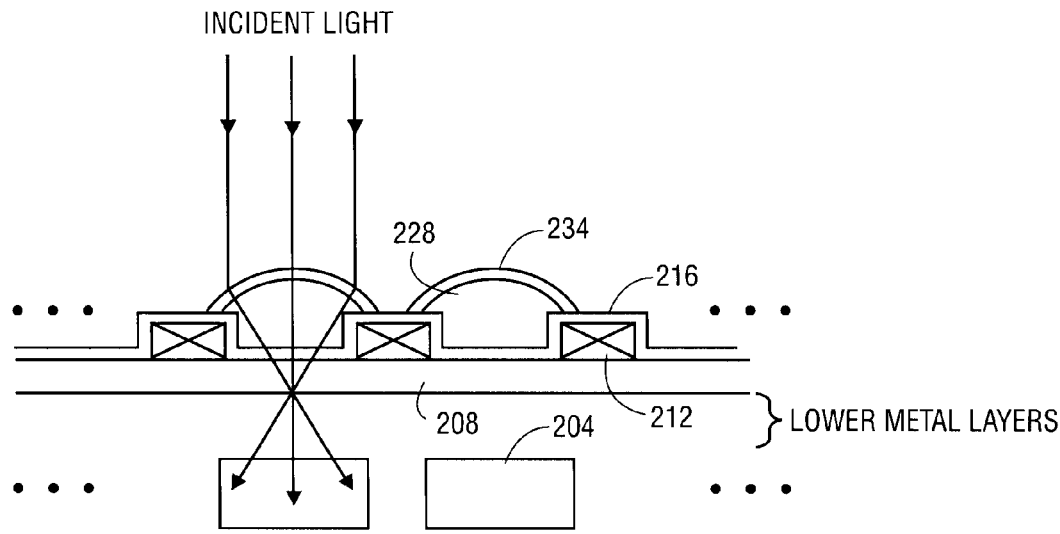
FIG. 2 illustrates a color sensor die according to an embodiment of the invention.

FIG. 2 shows a cross-sectional view of a portion of a color image sensor die according to an embodiment of the invention. The die may be formed according to conventional metal oxide semiconductor (MOS) integrated circuit fabrication processes, including those which are specifically optimized for implementing complex logic integrated circuits. The photosites 204 can be either photodiodes or photogates. These may be built at approximately the same level as or below a field oxide layer 208. Each photosite 204 is normally part of a respective one of a number of photocells arranged as an array. Each photocell in this sensor array may include reset circuitry and readout circuitry, collectively being reference 304 in FIG. 3, that provide a pixel signal in response to reset and select signals.

One or more layers of metal interconnect and interlayer dielectric (not shown) may be present between the photosite 204 and a passivation layer 216. In this case, only the top metal layer 212 obtained by a non-planar fabrication process is shown. The lines of the top metal layer that traverse the sensor array portion of the die may be used primarily for supplying power to the photocells. These lines in part define a well region over each photosite, as shown in the embodiment of FIG. 2.

A number of microlens structures each having a convex external surface and positioned inside a respective one of the wells above the passivation layer 216 are formed. A color filter layer is formed above the microlens and is in direct contact with the microlens structures and conforms to the convex external surface of the microlens. The entire optical structure that includes the color filter layer 234, the microlens 228, the passivation layer 216, and any lower layers, including oxides, spacers and interlayer dielectrics, above each photosite 204 is sufficiently transparent to allow incident light to pass through and be detected by the photosite.

Figure 3:
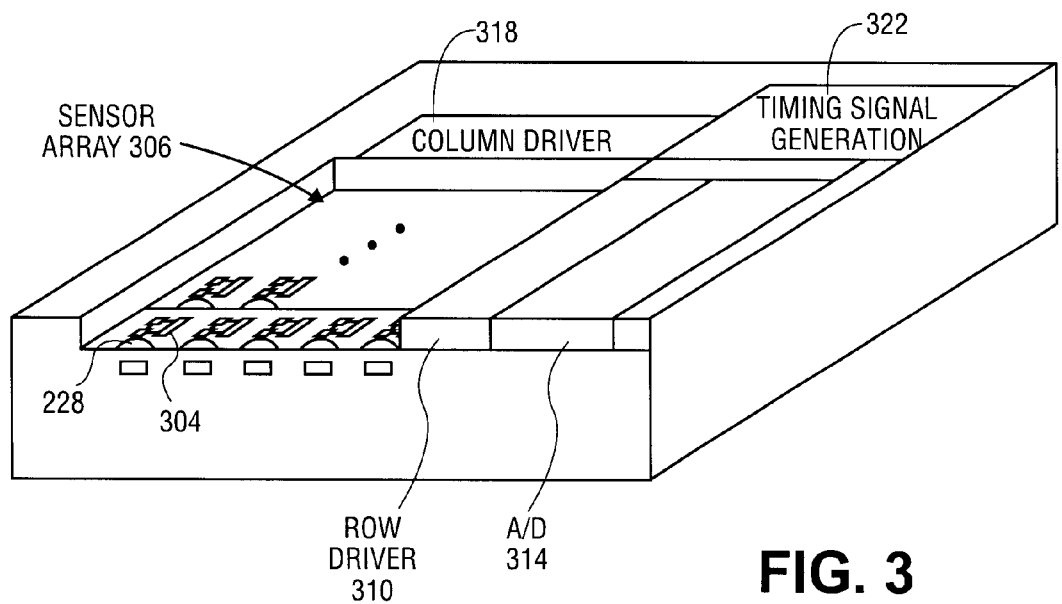
FIG. 3 shows a color sensor die according to another embodiment of the invention.

FIG. 3 illustrates another embodiment of the image sensor die in which the metal lines that are part of the top metal layer, and which form the wells in the sensor array portion shown in FIG. 2, are absent. In other embodiments, the die may be manufactured by a planar fabrication process in which there is no top metal layer and in which a dielectric layer on top of the die is ground to a smooth flat finish before forming the microlens structures. In such alternative embodiments, the top dielectric layer is not a separate planarization layer.

Returning to the embodiment in FIG. 3, the lines in the top metal layer have been routed outside the sensor array portion, and power to the sensor array is supplied through the lower set of layers (not shown.) The sensor die also includes row driver circuitry 310 and column driver circuitry 318 that drive a select signal into each photocell to enable readout from a selected one or more of the photocells. Timing signal generation circuitry 322 controls the timing of the select signal for sequentially accessing rows of the photocells. Analog to digital conversion circuitry 314 is also included aboard the die, in this embodiment only, to digitize the analog pixel signals. This integrated configuration in FIG. 3 that includes both the sensor array and analog/digital control and processing circuitry may be built using advanced MOS logic IC fabrication processes having four metal layers.

Figure 4:
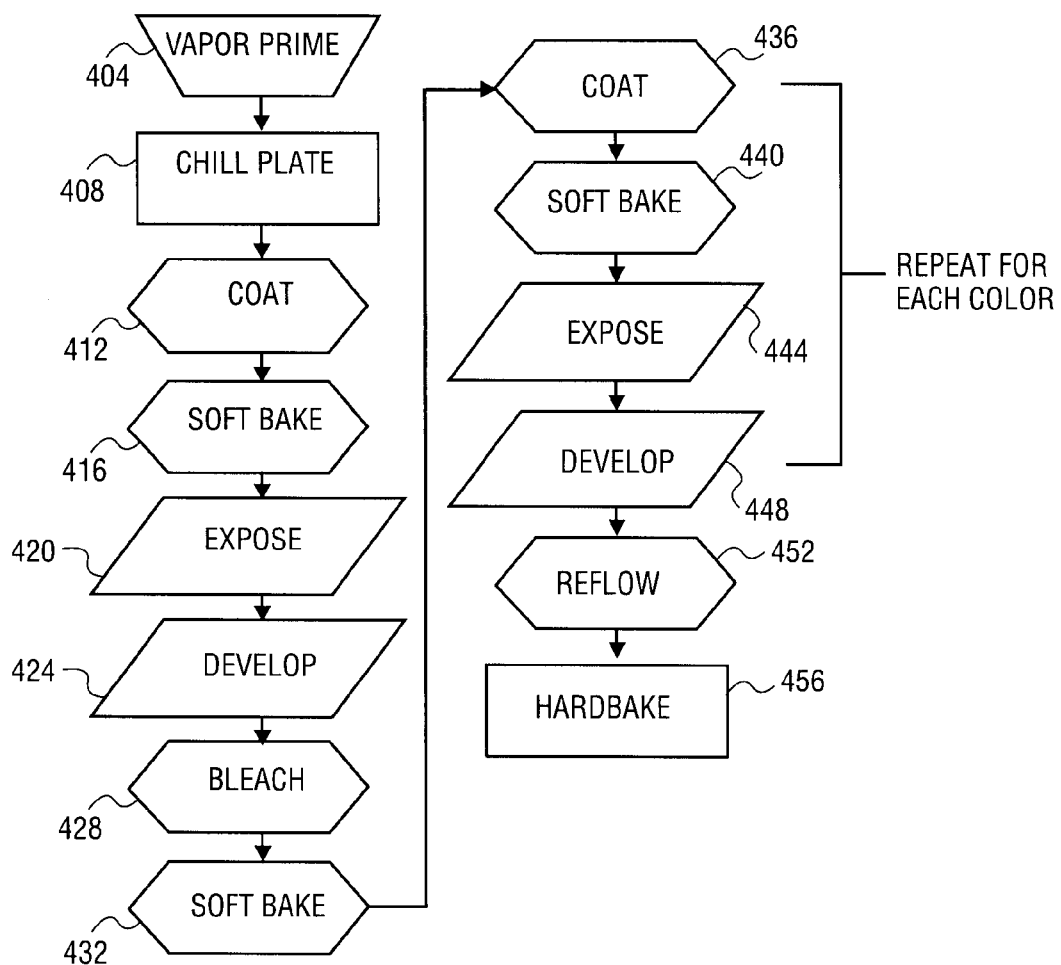
FIG. 4 shows a portion of a process flow for manufacturing a color sensor die according to an embodiment of the invention.

FIG. 4 shows a portion of a process flow for manufacturing a color sensor die according to an embodiment of the invention. More specifically, the process flow in FIG. 4 describes only the microlens and color filter formation steps applied to the semiconductor wafer following the passivation step. The fabrication steps for building and interconnecting the photocells, and depositing and forming the passivation layer are not described in any detail because such steps are well known to those of ordinary skill in the art. Also, the description below may include specific steps and measurements that are only given as examples and should not be used to limit the scope of the invention.

The process control variables for fabricating the microlens structures include the initial thickness of the microlens material (in step 412), the separation distance between photosites (in step 420), and the reflow temperature and baking time (in step 452). The flow in FIG. 4 begins with step 404 in which the passivation layer on the wafer is primed. This may be done according to a vapor prime procedure by placing the wafer in a heated atmosphere with an adhesion promoter. The wafer is then brought back to room temperature in step 408, and spin-coated with a microlens material, according to step 412, to a thickness of several microns. The microlens material is placed directly in contact with the passivation layer, without a planarization layer therebetween. The microlens material in general includes an acrylate polymer such as the commercially available TMR-P7 from Tokyo Ohka Kogyo (TOK) Company of Japan. The wafer is then soft baked as in step 416 to drive off the solvent in the coated microlens material to yield a substantially transparent polymer film.

The TMR-P7 material includes a photoactive compound (PAC) which is positive photoactive, such that the exposed areas of the microlens material become soluble and can then be removed from the wafer. Thus, in the mask and exposure step 420, the microlens areas above each photosite are masked off before exposing the wafer. The photoactive material is then developed in step 424 to remove the exposed areas of the microlens material, leaving substantially rectangular microlens "stumps" above each photosite. The expose and develop steps should be adjusted to yield a stump with essentially vertical sides, as opposed to sides that are slanted inwards or outwards. The vertical sides help yield a more circular microlens structure.

Following the develop step 424, the microlens stumps are bleached by, for instance, exposing the wafer to deep ultra violet light for several seconds, as in step 428. This may be needed to yield a more transparent microlens, because the remaining photoactive compound in the unexposed material should be converted. An additional soft bake step 432 helps complete the bleach reaction, leaving the microlens stumps ready for receiving the color filter layer.

The formation of the color filter layer begins with step 436 in which a layer of color filter material for a first color (e.g., red) is spin coated onto the microlens stumps. The color filter materials used should have the appropriate viscosity and polarity of solvent so as to keep the color particles in suspension in the color filter material. This means that different spin coating procedures will be followed depending on the color being coated. The color material may include color filter materials by FUJI FILM-OLIN of Japan and by TOK of Japan. The thickness of the color material is a function of the required color point for each color, given by the industry standard CIE parameters X and Y. The thickness of the material also determines the color saturation level. This is followed with a soft bake procedure in step 440, and then with step 444 in which the regions of the wafer corresponding to photocells of the first color (red) are exposed through a mask and are therefore cross-linked. The color filter material is then developed in step 448, where its exposed portions corresponding to the first color are insoluble and therefore remain on the wafer. The steps 436–448 may be repeated several times to create additional color filter regions (e.g., blue and green) over the remaining microlens stumps. For instance, a red, blue, and green Bayer pattern may be created on each sensor array.

Once the different color filters have been created, the wafer is subjected to a reflow procedure in step 452, by, for instance, exposing it to UV light at high temperatures to cross-link the microlens material. The microlens stumps begin to melt and flow to form a convex external surface of the microlens structures as shown in FIG. 2. The color filter on top of each of the microlens stumps bends without changing state (because the Tg, glass transition temperature, of the color filter is higher than that of the microlens material), and conforms to the convex external surface beneath itself, to yield the color filter layer. To chemically set the microlens structures and complete the cross-linking of the microlens structures and the color filter layer, a hardbake procedure may be performed as in step 456. This makes the sensor array resistant to chemical and physical attack without requiring any further passivation layer. The sensor array, as well as the rest of the image sensor die, may now be tested while still part of the wafer.

As an alternative to the above described sequence, the reflow procedure in step 452 may be performed simultaneously with the bleach step 428 and/or the soft bake in step 432, rather than after the color filter developing step 448. In that case, the color filter materials are coated onto microlens structures having the convex external surface rather than the microlens stumps.

Figure 5:
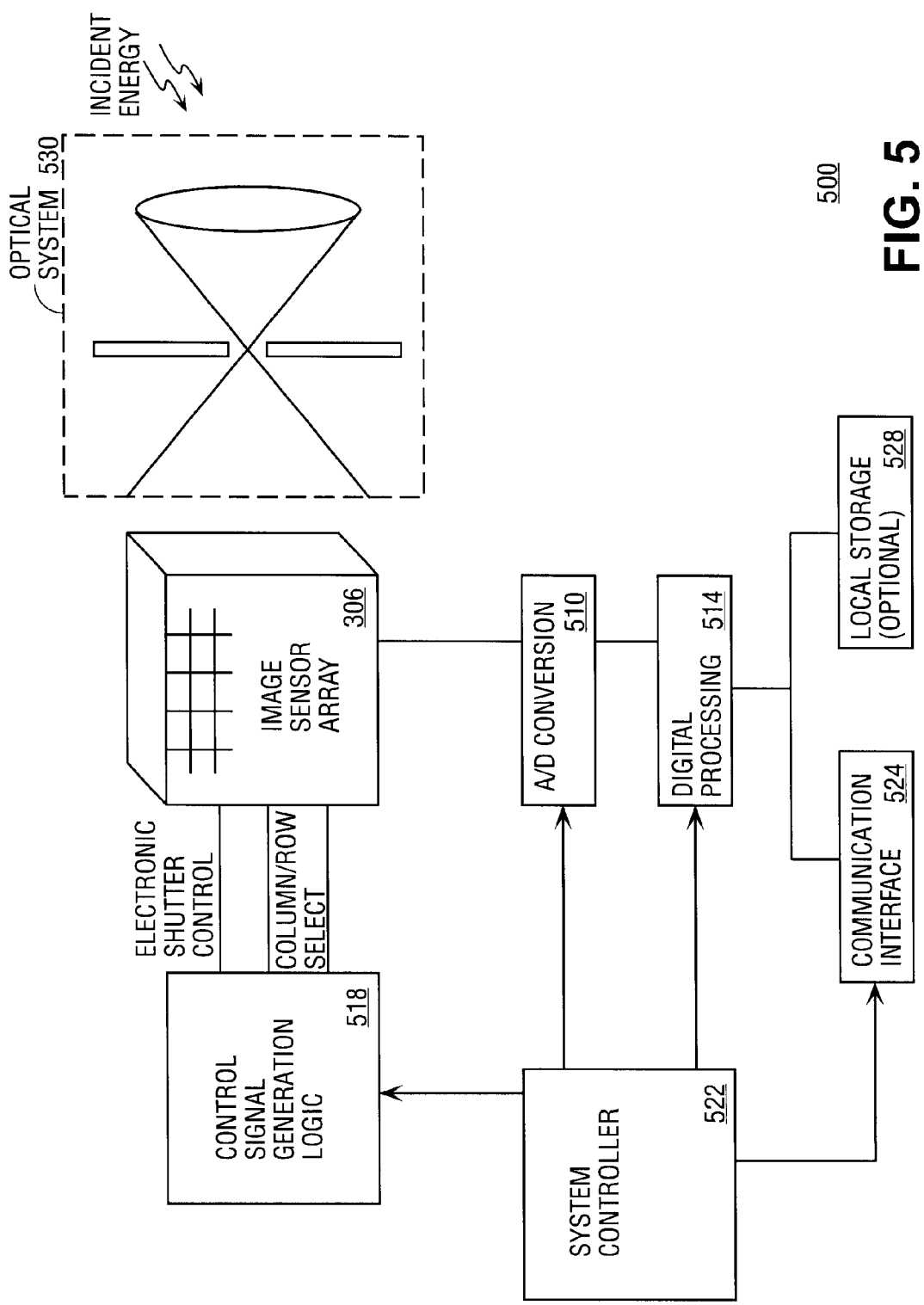
FIG. 5 depicts an electronic imaging system that features a color sensor die.

The manufactured sensor array 306 and its alternatives described above may be used as part of a digital imaging system 500 shown in functional block diagram form in FIG. 5. The imaging system 500 has an optical system 530 that channels incident energy, being visible light in one case, to create an optical image on an image sensor array 306. Control signal generation circuitry 518 is provided to generate electronic shutter control signals and row/column select lines needed to control the photocells of the image sensor. Sensor signals are then further processed by an A/D conversion unit 510 which digitizes the sensor signals and feeds a digital processing block 514. The bitlines from the sensor array 306 may be multiplexed to a single A/D converter or they may each have a dedicated respective A/D converter. The A/D unit 510 and portions of the digital processing block 514 may be located on the same die as the image sensor 306 as shown in FIG. 3. The digital processing may be done by hardwired logic and/or a programmed processor that performs a variety of digital image processing functions, including perhaps preparing compressed digital image data based on the sensor signals for more efficient storage or transmission.

Transmission of the image data to an external processing system such as a stand alone personal computer may be accomplished using the communication interface 524. For instance, as a digital camera, the communication interface implements a computer peripheral bus standard such as universal serial bus (USB) or a high speed serial bus protocol. The imaging system 500 as a digital camera may also contain a local storage 528 of the non-volatile variety, for instance including a solid state memory such as a removable memory card, a rotating magnetic disk device, or other suitable memory device for permanent storage of digital image data. The operation of the system 700 may be orchestrated by a system controller 522 which may include a conventional microcontroller responding to instructions stored as firmware.

To summarize, various embodiments of the invention directed to a method of manufacturing a color image sensor die without making a planarization layer, and by forming the color filter layer above the microlens structure rather than below it as done conventionally, have been described. In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather that a restrictive sense.

What is claimed is:

1. A semiconductor die, comprising:
   a plurality of photodetecting sites;
   a plurality of microlens structures each positioned above a respective one of the photodetecting sites;
   a color filter layer disposed above the microlens structures;
   an oxide layer disposed below the microlens structures; and
   a metal layer disposed above the oxide layer and defining metal lines that cross a region of the die containing the photodetecting sites, the metal lines defining a plurality of wells each positioned above a respective one of the photodetecting sites, and each of the microlens structures being positioned inside a respective one of the wells so that a lower portion of each microlens structure, which contains the same material as an upper portion thereof, extends below a top surface of the metal lines.

2. The semiconductor die of claim 1 wherein the microlens structures have a convex external surface, and the color filter layer conforms to the external surface.

3. The semiconductor die of claim 2 further comprising:
   a passivation layer disposed above the photodetecting sites, the microlens structures being positioned above the passivation layer.

4. The semiconductor die of claim 3 wherein the color filter layer is in contact with the microlens structures.

5. The semiconductor die of claim 4 wherein the passivation layer covers the metal layer and the photodetecting sites.

6. The semiconductor die of claim 5 further comprising:
   a plurality of lower metal layers below said metal layer.

7. The semiconductor die of claim 6 wherein said metal layer is a top metal layer and defines metal lines that provide power to the photodetecting sites.

8. The semiconductor die of claim 6 wherein the photodetecting sites include photodiodes.

9. The semiconductor die of claim 6 wherein a photosensitive region of each of the photodiodes is positioned entirely underneath the oxide layer.

10. The semiconductor die of claim 5 wherein the die is manufactured according to a MOS logic integrated circuit fabrication process having a plurality of metal layers, a lower set of the layers crossing over the region of the die containing the plurality of photodetecting sites that are part of a plurality of photocells that also contain active circuitry.

11. An imaging system comprising:
    an image sensor having a plurality of photodetecting sites, a plurality of microlens structures each positioned above a respective one of the photodetecting sites, a color filter layer disposed above the microlens structures, an oxide layer disposed below the microlens structures, and a metal layer disposed above the oxide layer and defining metal lines that cross a region of the image sensor containing the photodetecting sites, the metal lines defining a plurality of wells each positioned above a respective one of the photodetecting sites, and each of the microlens structures being positioned inside a respective one of the wells so that a lower portion of each microlens structure, which contains the same material as an upper portion thereof, extends below a top surface of the metal lines, the plurality of photodetecting sites, microlens structure, and color filter layer define a plurality of photocells that can provide a plurality of sensor signals in response to incident light and according to a plurality of control signals;
    control circuitry to generate the control signals of the image sensor; and
    analog to digital conversion unit to digitize the sensor signals.

12. The imaging system of claim 11 further comprising:
    an optical system to receive the incident light and form an image on the image sensor; and
    communication interface to transfer the digitized sensor signals to a stand-alone image processing and display system separate from the imaging system.

13. The imaging system of claim 11 wherein the microlens structures have a convex external surface, and the color filter layer conforms to the external surface.

14. The imaging system of claim 13 wherein the image sensor further includes a passivation layer disposed above the photodetecting sites, the microlens structures being positioned above the passivation layer.

15. The imaging system of claim 14 wherein the color filter layer of the image sensor is in contact with the microlens structures.

16. The imaging system of claim 11 wherein the image sensor further comprises a plurality of lower metal layers below said metal layer.

17. The imaging system of claim 16 wherein the metal layer is a top metal layer that defines metal lines that provide power to the photodetecting sites.

18. The imaging system of claim 11 wherein the photodetecting sites include photodiodes.

19. The imaging system of claim 18 wherein a photosensitive region of each of the photodiodes is positioned entirely underneath the oxide layer.

20. The imaging system of claim 11 wherein the image sensor is manufactured according to a MOS logic integrated circuit fabrication process having a plurality of metal layers, a lower set of the layers crossing over the region of the sensor containing the plurality of photocells, and where the plurality of photocells also contain active circuitry.

21. The imaging system of claim 20 wherein power to the plurality of photocells in the image sensor die is carried by the lower set of the metal layers.

* * * * *